United States Patent [19]

Chen et al.

[11] Patent Number: 5,650,964

[45] Date of Patent: Jul. 22, 1997

[54] METHOD OF INHIBITING DEGRADATION OF ULTRA SHORT CHANNEL CHARGE-CARRYING DEVICES DURING DISCHARGE

[75] Inventors: Jian Chen, San Jose; James J. Hsu, Saratoga; Shengwen Luan; Yuan Tang, both of San Jose; David Kuan-Yu Liu, Cupertino; Michael A. Van Buskirk, San Jose, all of Calif.

[73] Assignee: Advanced Micro Devices, Inc., Sunnyvale, Calif.

[21] Appl. No.: 486,192

[22] Filed: Jun. 7, 1995

[51] Int. Cl.$^6$ .................................................. G11C 16/04
[52] U.S. Cl. .............................. 365/185.25; 365/185.27; 365/185.31
[58] Field of Search ................... 365/185.25, 185.26, 365/185.27, 185.29, 185.31, 185.18

[56] References Cited

U.S. PATENT DOCUMENTS

| | | | |
|---|---|---|---|
| 4,884,239 | 11/1989 | Ono | 365/185.27 |
| 5,077,691 | 12/1991 | Haddad | 365/185.29 |
| 5,396,459 | 3/1995 | Arakawa | 365/185.29 |
| 5,414,669 | 5/1995 | Tedrow | 365/185.29 |
| 5,416,738 | 5/1995 | Shrivastava | 365/185.26 |
| 5,452,248 | 9/1995 | Naruke | 365/185.29 |

OTHER PUBLICATIONS

Jian Chen, et al., *Subbreakdown Drain Leakage Current in MOSFET*, IEEE Electron Device Lett., vol. EDL–8, No. 11, pp. 515–517, Nov. 1987.

T.Y. Chan, et al., *The Impact of Gate–Induced Drain Leakage Current on MOSFET Scaling*, IEDM Technical Digest, pp. 718–721, 1987.

Chi Chang, et al., *Corner–Field Induced Drain Leakage In Thin Oxide MOSFETS*, IEDM Technical Digest, pp. 714–717, 1987.

*Primary Examiner*—David C. Nelms
*Assistant Examiner*—Son Mai
*Attorney, Agent, or Firm*—Fliesler, Dubb, Meyer & Lovejoy, LLP

[57] ABSTRACT

A process for discharging a floating gate semiconductor device formed in a semiconductor substrate, the device having a first active region, a second active region, a charge holding region, and a channel between the first and second active regions, the channel having a length defined by a distance below the charge holding region between the first and second active regions. The process comprises the steps of: applying a first positive voltage of about 4–8 volts to the first active region; applying a second voltage in the range of about 0.5–3 volts to the second active region; applying a third voltage in the range of minus 8 volts to the charge holding region; and coupling the substrate to ground. The first active region may comprise either a source or a drain region of a MOSFET, and the second active region may comprise a source region or a drain region of a MOSFET. In a further aspect an array of floating gate transistors, each transistor comprising a source, drain, gate and floating gate, each floating gate including an electric charge; and control logic coupled to the transistors, for selectively addressing the transistors is disclosed. In the apparatus, to discharge the floating gates of each transistor in the array: each source is coupled in common to a first voltage; each drain is coupled in common to a second voltage lower than the first voltage; the substrate is coupled to ground; and each floating gate is coupled to a negative voltage.

25 Claims, 18 Drawing Sheets

Channel length = less than 0.5 micrometers

METHOD OF INHIBITING DEGRADATION OF ULTRA SHORT CHANNEL CHARGE-CARRYING DEVICES DURING DISCHARGE

BACKGROUND OF THE INVENTION

1. Field of the Invention

The invention relates to improving the performance characteristics of charge carrying devices such as floating gate transistors utilized in flash memory devices, EEPROM, and other technologies.

2. Description of the Related Art

Flash memory devices have become an exceedingly popular form of data storage and are used in a multitude of applications where rapid access to data is required. Generally, a flash memory device comprises an array of electrically erasable memory cells. Each cell may be comprised of an EEPROM or EPROM floating gate transistor, with the cells organized in an array of columns and rows which are accessible by control circuitry on a row or column address basis. This is shown in FIG. 1, wherein two floating gate transistors 20 are shown coupled to column address logic 25 and row address logic 26. (FIG. 1 represents a NOR array; however, the invention discussed herein, and the principles discussed herein, are applicable to several types of memories.)

Flash EEPROM devices, and methods for making such devices, are well known in the art. In general, both the EPROM and EEPROM devices are characterized by a floating gate and an electrical connection to a control gate, both of which are fabricated out of bulk and other types of silicon doped with appropriate doping materials to render the silicon conductive. The flash EPROM device is characterized by charging of the floating gate using hot carrier injection and discharge of the floating gate device using Fowler-Nordheim tunneling, while the flash EEPROM device is characterized by the use of Fowler-Nordheim tunneling during both charging and discharge.

FIGS. 2A, 2B and 3A, 3B show a typical floating gate device 30. As shown therein, a silicon substrate 32 (in this embodiment a p-type silicon substrate), has formed therein an n+ source region 34 and an n+ drain region 36. A floating gate 38, generally comprised of deposited polysilicon or amorphous silicon, is shown overlying portions of source 34 and drain 36. A control gate 40 overlies floating gate 38. Two oxide regions 42, 44 separate control gate 40 from floating gate 38, and floating gate 38 from the surface of substrate 32, respectively.

As noted above, electrons are stored on floating gate in different ways, depending upon the type of device. FIG. 2A shows how charge is added to a typical flash EPROM cell through hot carrier injection. As shown therein, the control gate is typically coupled to +10 volts, the source to 0 volts, the drain to 5 volts, and the substrate to 0 volts. As a result, a conductive region across the channel is established and electrons accelerated into this region. Electrons are raised sufficiently in potential to overcome the insulating property of gate layer 42.

FIG. 2B shows the voltages used to add charge to the typical flash EEPROM cell by holding the potential of drain 36, source 34 and the substrate at 4 volts or 0 volts, and applying a pulse of approximately 10 volts to 18 volts to control gate 40 (depending upon whether the substrate region is a p-well or bulk silicon). Although not shown, in an EEPROM device a portion of the floating gate 38 is positioned above the tunnel dielectric closer to drain 36 than other regions of tunnel dielectric 44. The thin dielectric region coupled to the high voltage between the gate and drain produces Fowler-Nordheim tunneling of electrons into the floating gate 38.

FIGS. 3A and 3B graphically illustrate the discharge operation of a floating gate device in flash memory, which results in significant drain source and substrate current due to band-to-band tunneling in the gate-to-source overlap region. (For purposes of simplicity, in FIG. 3B, the control gate is not shown.) As should be readily understood, discharge of floating gate is one of the two most fundamental operations for any non-volatile memory device. It should be further recognized that the action of discharging electrons from the floating gate can be an erase function, where charging the floating gate is equivalent to writing a data bit to the gate, or it could be a write function, where all the bits are charged and then selectively discharged to show data on the gate.

As shown in FIG. 3A, in a typical discharge operation, the voltage of the source is 4 volts, the voltage at the control gate is (−)8 volts, the drain voltage is left floating, and the substrate 32 is coupled to ground. During this discharge operation, electrons on floating gate 38 should be drawn toward the source and vacancy holes along line 46 (FIG. 3B), to ground.

As shown in FIG. 3B, an alternative method for discharging the gate, the floating gate is held at (−)4 volts, the source voltage is held at +4 volts, and the drain is left floating. This condition is typical for memory arrays such as that shown in FIG. 1 wherein the entire array is being discharged simultaneously.

FIG. 3B shows conditions under which the band-to-band tunneling effect has been observed. The effect has been studied in several contexts to determine its effect on MOS transistors. In the case represented in FIGS. 3A and 3B, the desired effect is to drive electrons toward collection at the source region (as shown in FIG. 3B), while holes are collected in the substrate. A current has been found in MOSFETS at breakdown voltages much below what is usually considered the breakdown voltage of the device, typically in devices with thin oxides. See, Jian Chen, et al., *Subbreakdown Drain Leakage Current in MOSFET*, IEEE ELECTRON DEVICE LETT., vol. EDL-8, no. 11, pp. 515–517, November, 1987; T. Y. Chan, et al., *The Impact of Gate-Induced Drain Leakage Current on MOSFET Scaling*, IEDM TECHNICAL DIGEST, pp. 718–721, 1987; and Chi Chang, et al., *Corner-Field Induced Drain Leakage In Thin Oxide MOSFETS*, IEDM TECHNICAL DIGEST, pp. 714–717, 1987. Although solutions have been proposed which include establishing a minimum oxide thickness or limiting the voltage of the potential difference during discharge, such options are not advantageous or suitable for continued scaling of devices to ever smaller channel lengths.

SUMMARY OF THE INVENTION

Thus, an object of the invention is to reduce the degradation of the performance of short channel floating gate devices.

A further object of the invention is to reduce the degradation of short channel devices without inhibiting the performance of such devices.

Yet another object of the invention is to reduce the degradation of short channel devices in a manner which does not affect the physical design of the device itself.

These and other objects of the invention are provided in a process for discharging a floating gate semiconductor device formed in a semiconductor substrate, the device having a first active region, a second active region, a charge holding region, and a channel between the first and second active regions, the channel having a length defined by a distance below the charge holding region between the first and second active regions. The process comprises the steps of: applying a first positive voltage of about 4–8 volts to the first active region; applying a second voltage in the range of about 0.5–3 volts to the second active region; applying a third voltage in the range of minus 8 volts to the charge holding region; and coupling the substrate to ground. The first active region may comprise either a source or a drain region of a MOSFET, and the second active region may comprise a source region or a drain region of a MOSFET.

A further aspect of the invention comprises an array of floating gate transistors, each transistor comprising a source, drain, gate and floating gate, each floating gate including an electric charge; and control logic coupled to the transistors, for selectively addressing the transistors. In the apparatus, to discharge the floating gates of each transistor in the array: each source is coupled in common to a first voltage; each drain is coupled in common to a second voltage lower than the first voltage; the substrate is coupled to ground; and each floating gate is coupled to a negative voltage.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION OF THE PREFERRED EMBODIMENTS

Figure 2A:
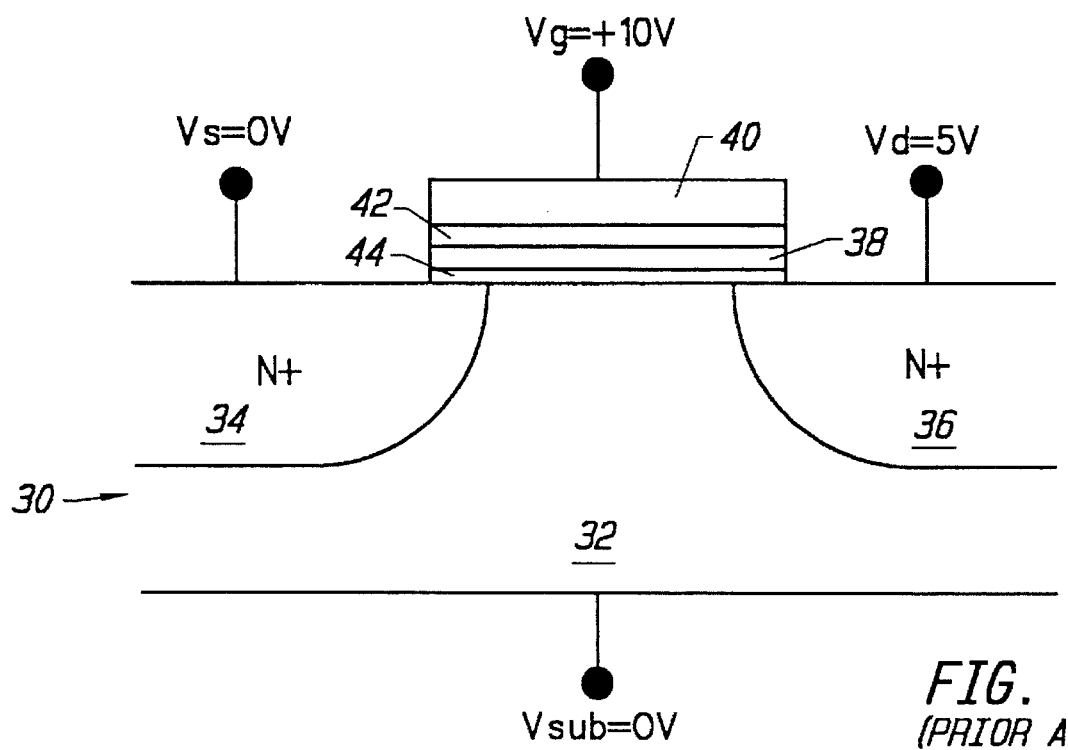
FIGS. 2A and 2B illustrate charging a floating gate transistor, such as an electrically erasable programmable read-only memory (EEPROM) device.
Figure 2B:
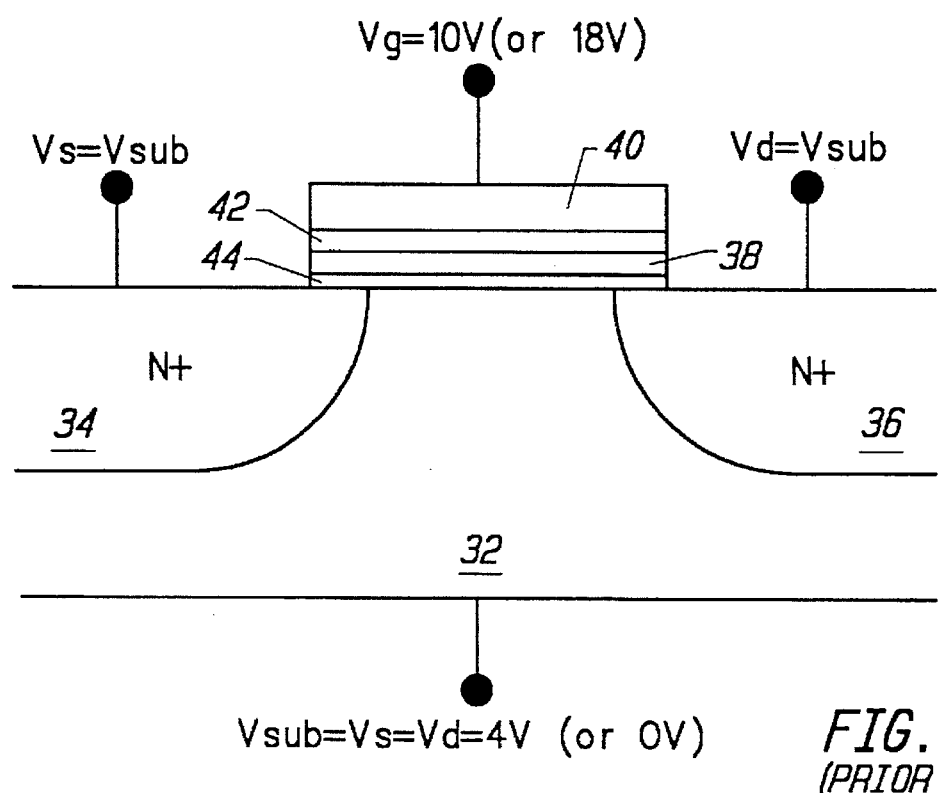
Figure 3A:
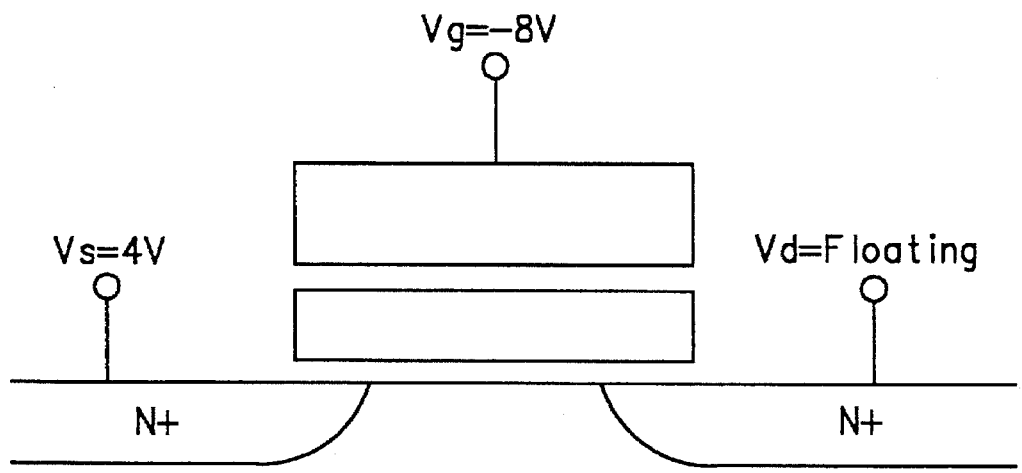
FIGS. 3A and 3B are representations of a floating gate device during discharge, and the band-to-band tunneling effect.

The present invention presents a scheme for dealing with the degradation of performance of short-channel (0.5 μm and below) devices caused during discharge of electrons from the charge carrying region, such as a floating gate, of such devices. The inventors of the present invention discovered, through empirical data as described herein, that floating gate devices with relatively short channel lengths (less than 0.5 μm) exhibited continued charge/discharge performance degradation when repeatedly erased and charged. Moreover, degradation of such devices after continuous charges and discharges was strongly dependent upon the channel length of the devices under the conditions shown in FIGS. 2 and 3 to induce discharge.

Figure 3B:
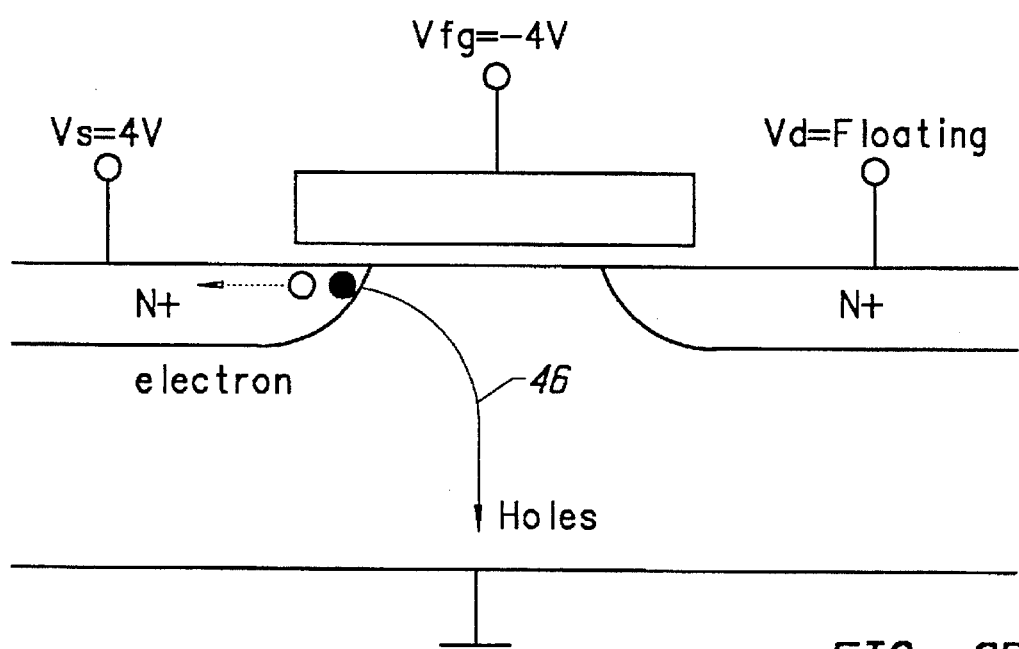
Figure 4:
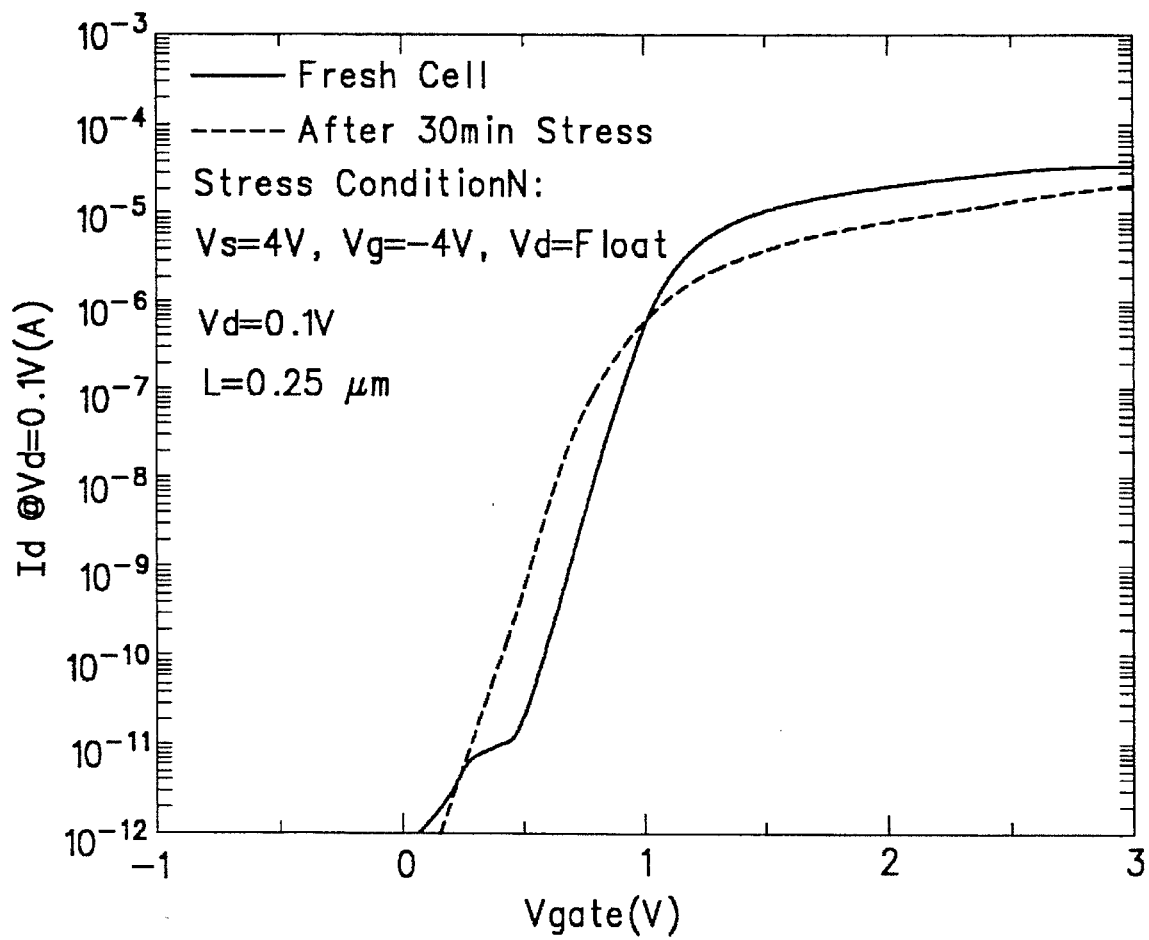
FIGS. 4–7 are graphs representing the degradation of discharge of various channel length devices under a static set of discharge conditions.
Figure 5:
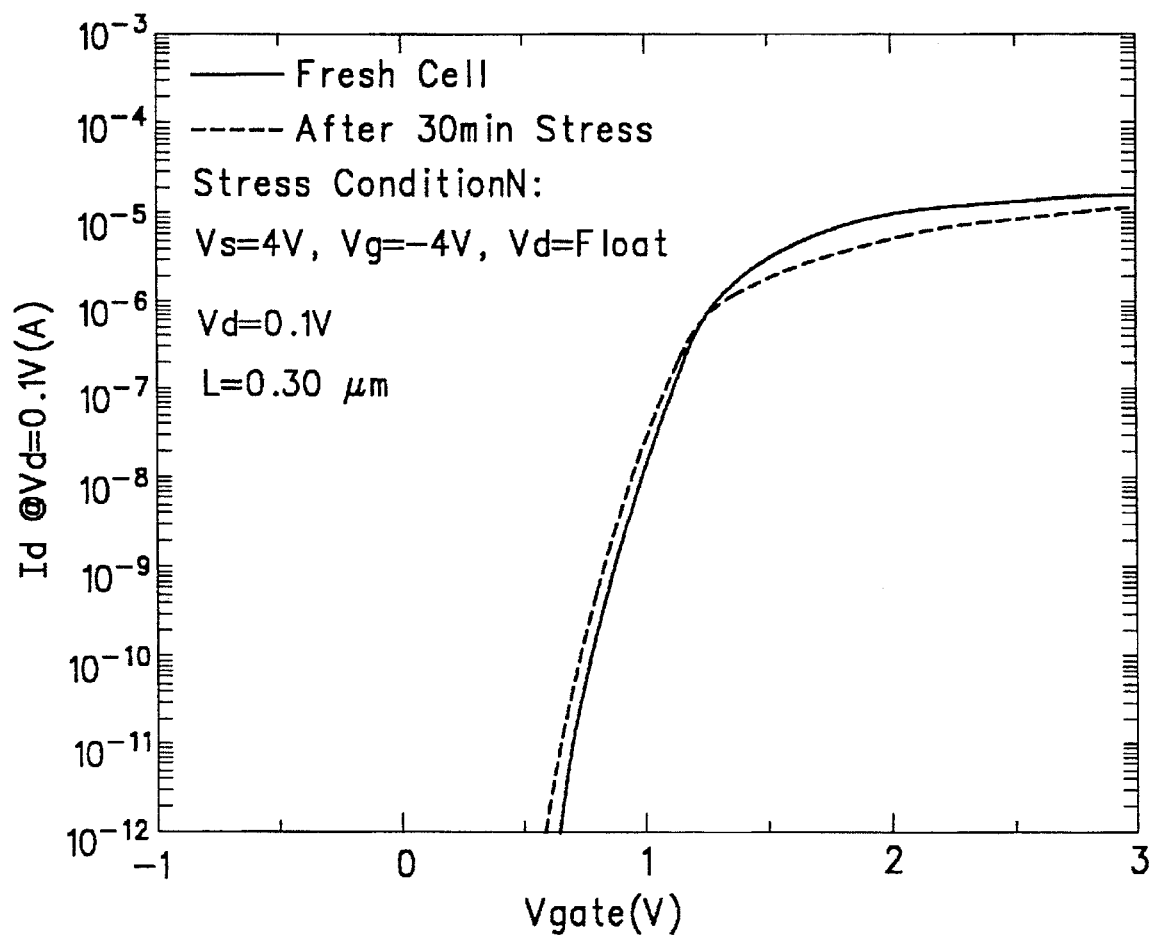
Figure 6:
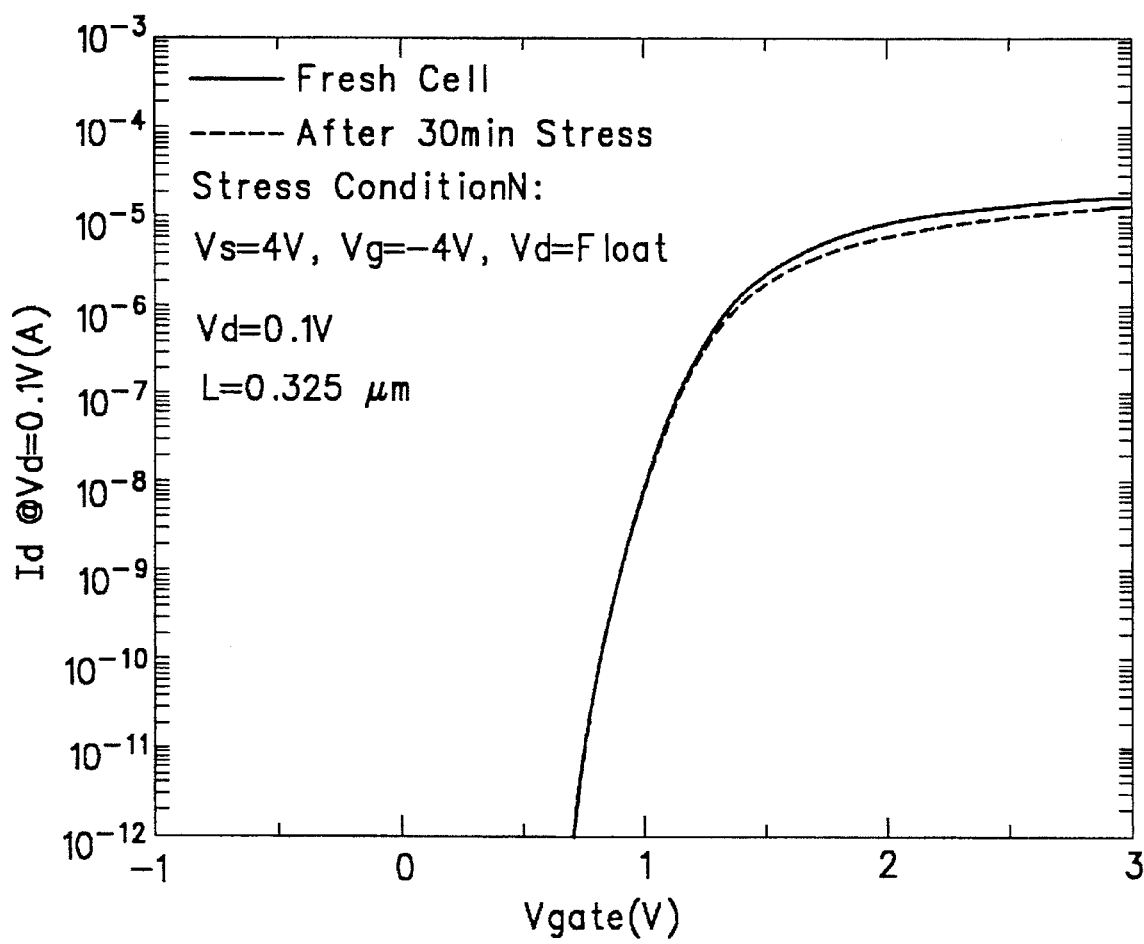
Figure 7:
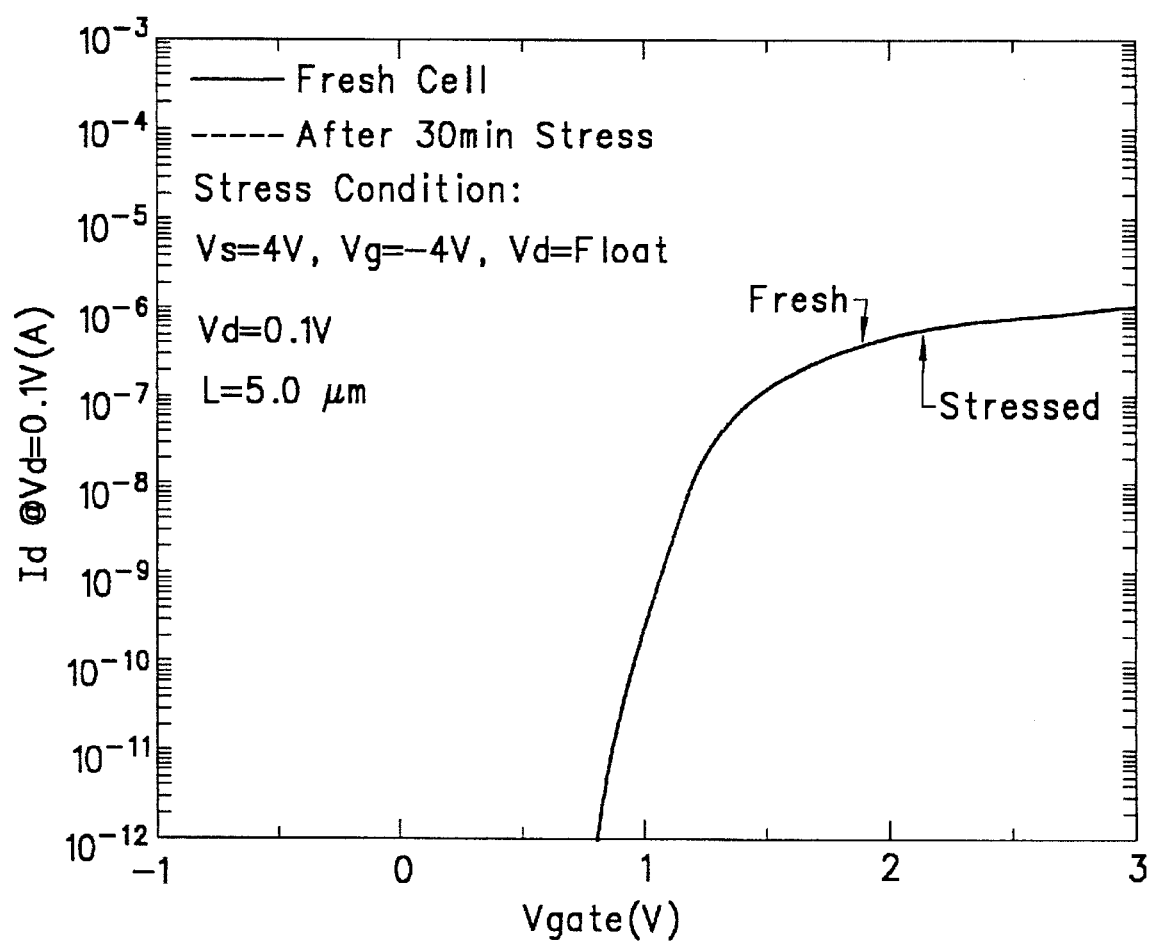

FIGS. 4 through 7 show the experimental results which represent degradation of floating gate devices whose drain, gate and source are coupled under the conditions shown in FIG. 3B for various channel lengths. Each figure represents the drain current ($i_d$) vs. gate voltage ($v_g$) of fresh (i.e., first time discharged) and 30-minute stressed devices. The channel lengths shown in FIGS. 4 through 7 are 0.25 micrometers, 0.30 micrometers, 0.325 micrometers, and 5.0 micrometers, respectively. As shown in FIG. 7, for a device with a channel length of 5.0 μm the stressed and fresh discharge curves of the device are essentially the same. As the channel length decreases in the devices represented in FIGS. 6, 5, and 4, a shift in the 30-minute stressed device's discharge curve to the left indicates positive hole trapping in the floating gate. More importantly, the slope of the curve degrades due to additional stress in the shorter channel cells which is required to repeatedly charge and discharge the device.

Thus, as one scales the channel length of devices to ever smaller dimensions, the damage which occurs during discharge becomes a fundamental limitation for device reliability and operation. In order to prevent such device degradation, one would have to either maintain the channel lengths of the devices at a finite minimum, or to significantly reduce the voltage which one is able to apply to the junction, neither of which are desirable since increasing the channel length will result in larger devices, while decreasing the voltage will result in larger and unacceptable discharge times, which are extremely important for programming.

Figure 8:
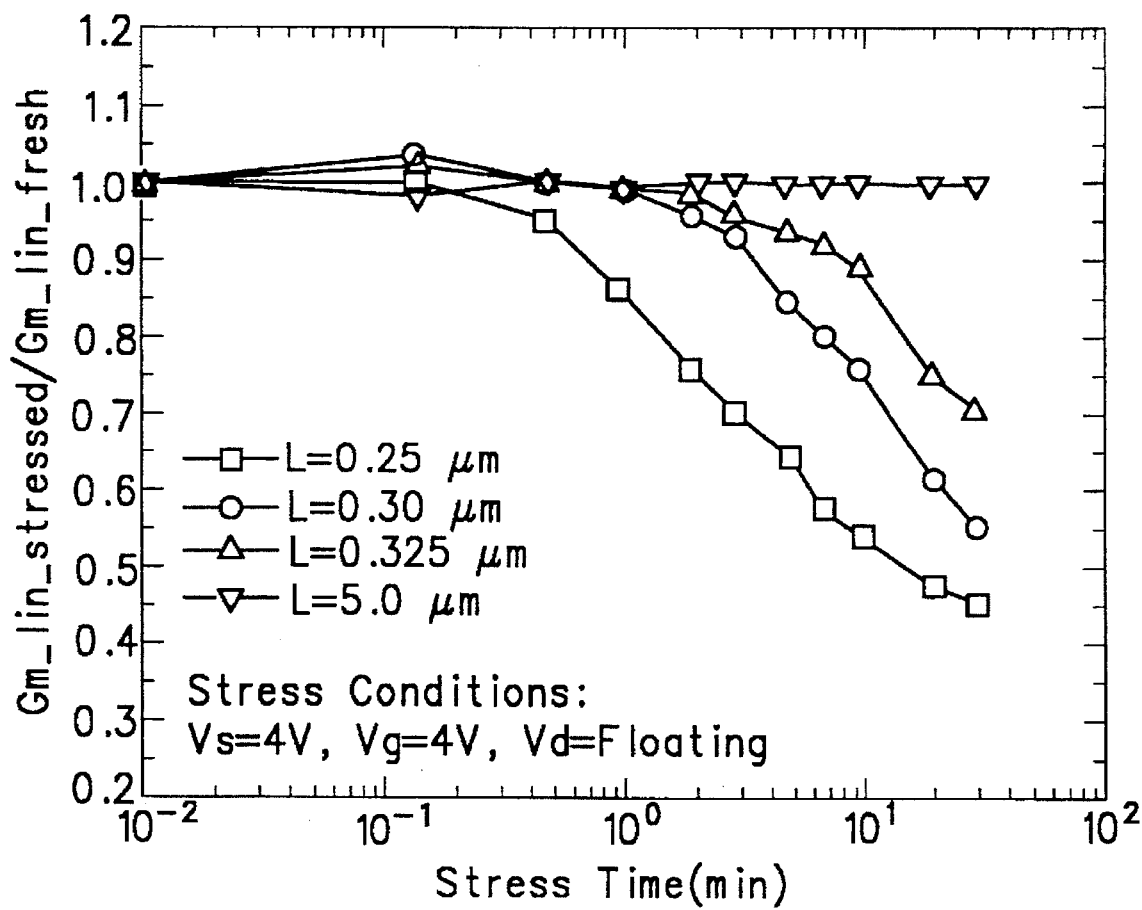
FIGS. 8 and 9 are graphs of the linear transconductance degradation as a function of time and channel length.

The results shown in FIGS. 4 through 7 are correlated by the results shown in FIG. 8. FIG. 8 shows the measured linear transconductance (GM) degradation as a function of time for devices of varying channel lengths. Consistent with FIGS. 4 through 7, FIG. 8 shows the devices with shorter channel lengths exhibit significantly more transconductance degradation.

Figure 9:
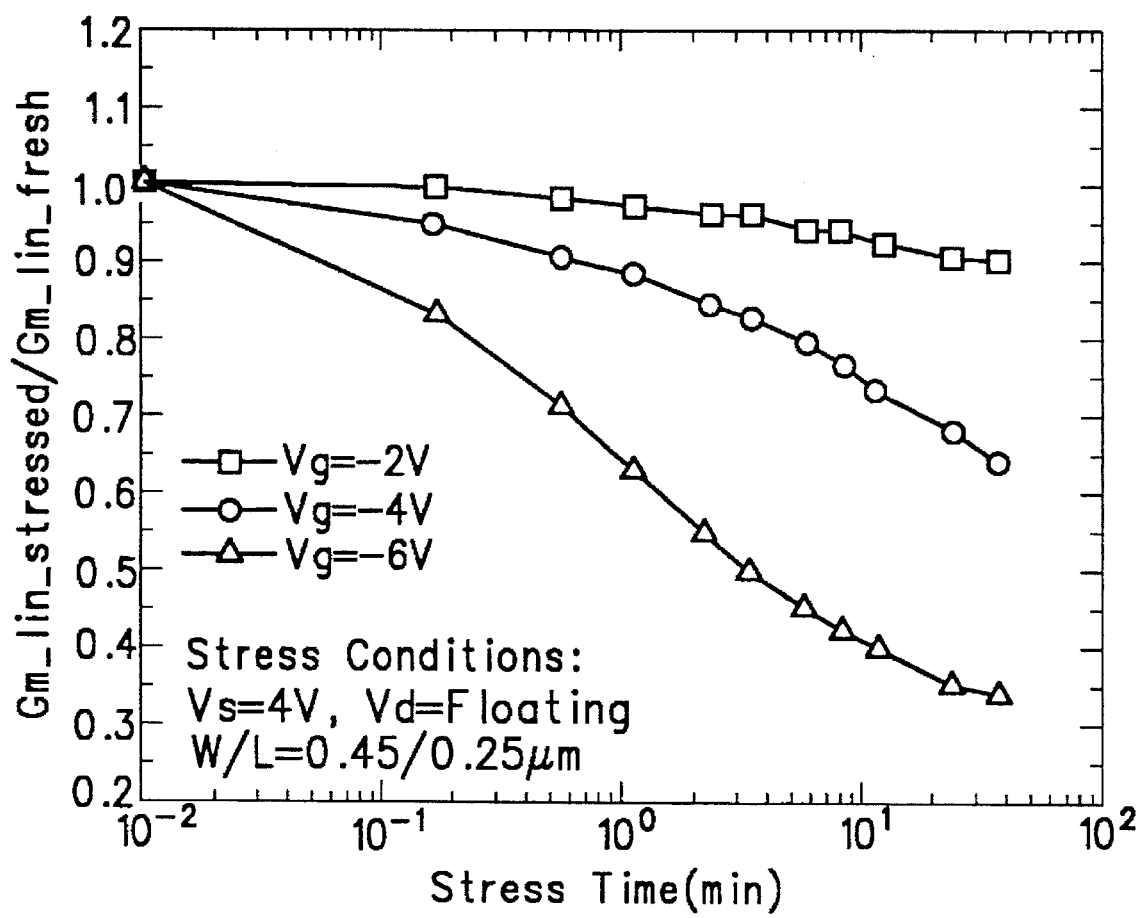

FIG. 9 shows the transconductance degradation as a function of time for increasing negative gate voltages corresponding to the beginning of an erase cycle ($V_g$=−6 volts) and the end of the erase ($V_g$=−2 volts). As shown in FIG. 9, the transconductance degrades more for the $V_g$=−6 volt condition, showing that more damage occurs at the beginning of the erase cycle than at the end of the erase cycle.

Figure 10:
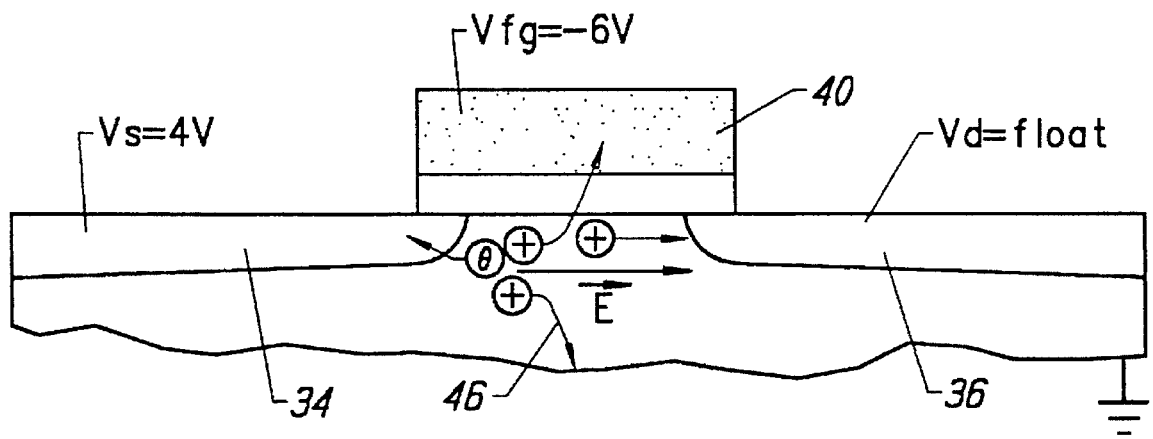
FIG. 10 is a block cross-section of a memory transistor representing the understanding of the physical processes occurring in the subject of the present invention.

FIG. 10 shows the physical understanding attributed by the inventors of the present application to the degradation effects seen in the Figures. It is believed that during discharge of short channel devices in a memory array such as that shown in FIG. 1, where device channel lengths are extremely small, with the drain is left at a floating potential, and 4 volts or so are applied to the source junction, the depletion region of the source junction is very close to or touching the drain junction. In a practical sense, the potential of the drain is not truly floating but is actually zero volts at the very beginning of the discharge operation. As a result, due to the extremely short channel, there is a strong lateral electric field $\vec{E}$ across the channel (between the 4 volts at the source and 0 volts at the drain). As should be generally understood, this field strength will increase as channel lengths decrease. As the holes generated by band-to-band tunneling current flow to the substrate, not all of the holes are drawn to ground. Rather, some are drawn by the lateral field and trail along the channel, where the negative gate voltage pulls them to the gate electrode. As these "stray" holes bombard the substrate surface, they damage the dielectric interface 44, get trapped, and create interface states in the dielectric.

Because channel length devices are only now approaching smaller and smaller lengths where this effect will be repeatedly seen, this effect will have greater and greater significance on memory array design. As shown in FIG. 10, after each typical programming of the gate, when the drain voltage is not truly floating, the potential difference between the source and drain will continually draw holes generated by band-to-band tunneling into the substrate, which will bombard the substrate surface and damage the interface.

Note that this phenomenon has not been seen in longer channel devices (0.5 μm and above) because, with the drain floating, a positive voltage $V_s$ on the source, and a negative potential in the floating gate, even with the drain at the initial potential of zero, the source-drain lateral field $\vec{E}$ is, at best, very weak or not existent. When the channel is very short, the depletion region of the source junction is close to the drain junction, and some of the source voltage will be coupled to the drain. The hole current, caused by band-to-band tunneling to the lowest potential substrate, will also float to the drain since the drain is at zero potential. This hole current flow along the surface will charge up the drain, and the component of current will cease once the drain node is charged up to a certain potential higher than zero volts. It is therefore believed that a transient current is charging the floating drain node. Because a negative potential exists on the floating gate, it will pull up holes in the semiconductor substrate to the surface and the floating gate. For a short channel device, because the shortest voltage is dropped across a short distance, the lateral field $\vec{E}$ is very high. The holes will also gain energy along the channel. When the vertical field pulls these holes through the floating gate, they bombard the surface, causing faster and faster erases, hole trapping, and interface damage.

Figure 11:
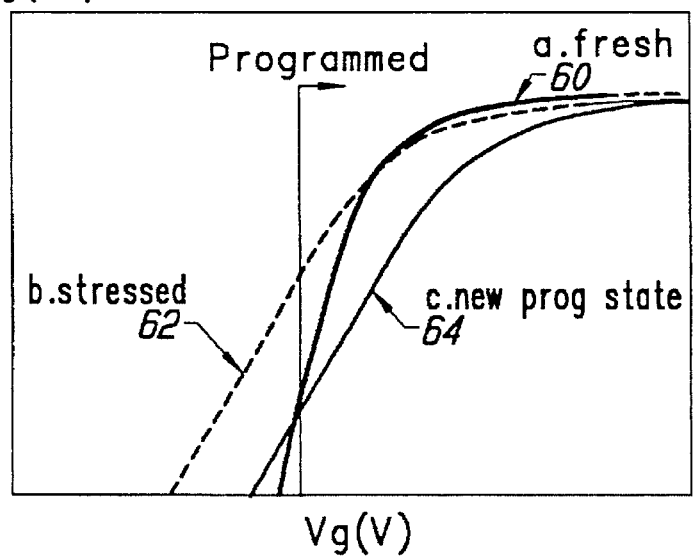
FIG. 11 is a graph of the degradation of a short-channel floating gate device illustrating the increase in the slope of the current vs. voltage curve required for programming the device after constant degradation.

This ever-worsening "cycle" of degradation is shown in FIG. 11, which shows transconductance vs. gate voltage for two cycles. As the short channel cell transconductance and threshold slope degrades, it is harder to turn the cell off by moving electrons to the floating gate. As shown in FIG. 11, a fresh cell represented at line 60 has a slope much greater to one than the stressed cell along line 62 and the newly-programmed cell along line 64. As the cell degrades, one will have to charge the cell with increasing voltages in order to verify that the device is, in fact, at a "0" state (no current). (Typically, memory arrays such as that shown in FIG. 1, include a state verify sequence wherein the central logic performs a state verify on the devices in the array.) By doing so, more electrons are injected into the gate and cause more drain side transconductance degradation. During the next subsequent erase of the short channel cell, because it was programmed with a higher programming voltage, the vertical field will be even higher. Again, because it has a shorter channel length, it is more prone to the above-mentioned channel length dependent erasing degradation. Therefore, the cell has even worse degradation than the previous cycle due to more negative floating gate potential. This cycle will continue, and the cell will degrade even faster after each independent cycle. In essence, this can lead to a runaway situation.

Figure 12:
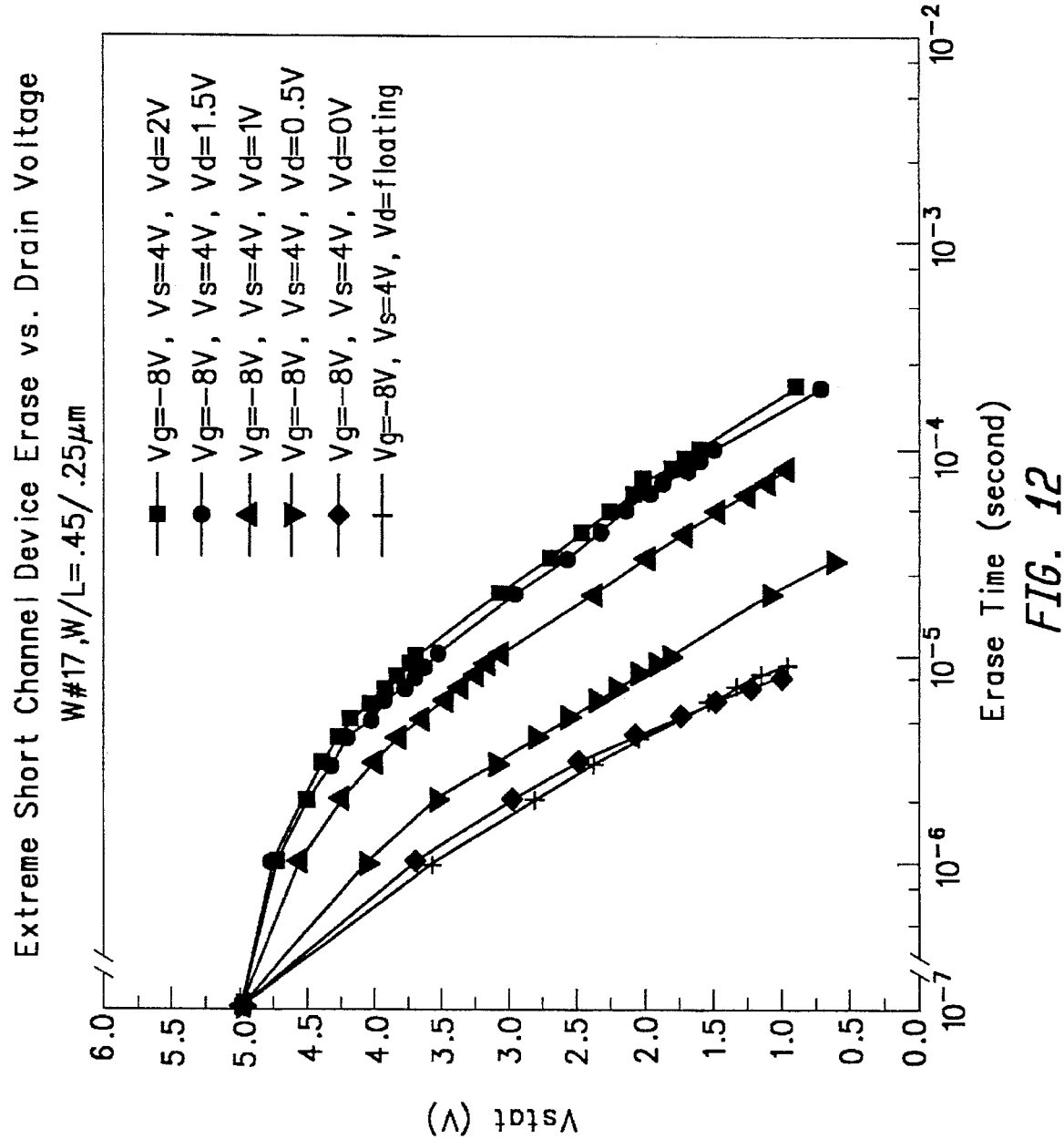
FIG. 12 is a graph of the saturation threshold voltage $V_t$ vs. time for a short-channel device under varying discharge conditions.

Another drawback of the channel length dependence erase degradation is that the cell with the short channel length will erase at an uncontrollably fast rate. As shown in FIG. 12, this may lead to some very fast erasure of certain bits. FIG. 12 represents the erasure time of a 0.25 μm device as a function of the saturation threshold voltage $V_{tsat}$ of the device. Various erase conditions are shown. A wide erased threshold voltage $V_t$ distribution leads to column line leakage currents. The fast erase bits, wide $V_t$ distribution, and column leakage currents are major problems in a flash memory and may need to be eliminated. As shown in FIG. 12, the worst case is represented where $V_d$ is floating or at zero (0) volts.

Figure 13:
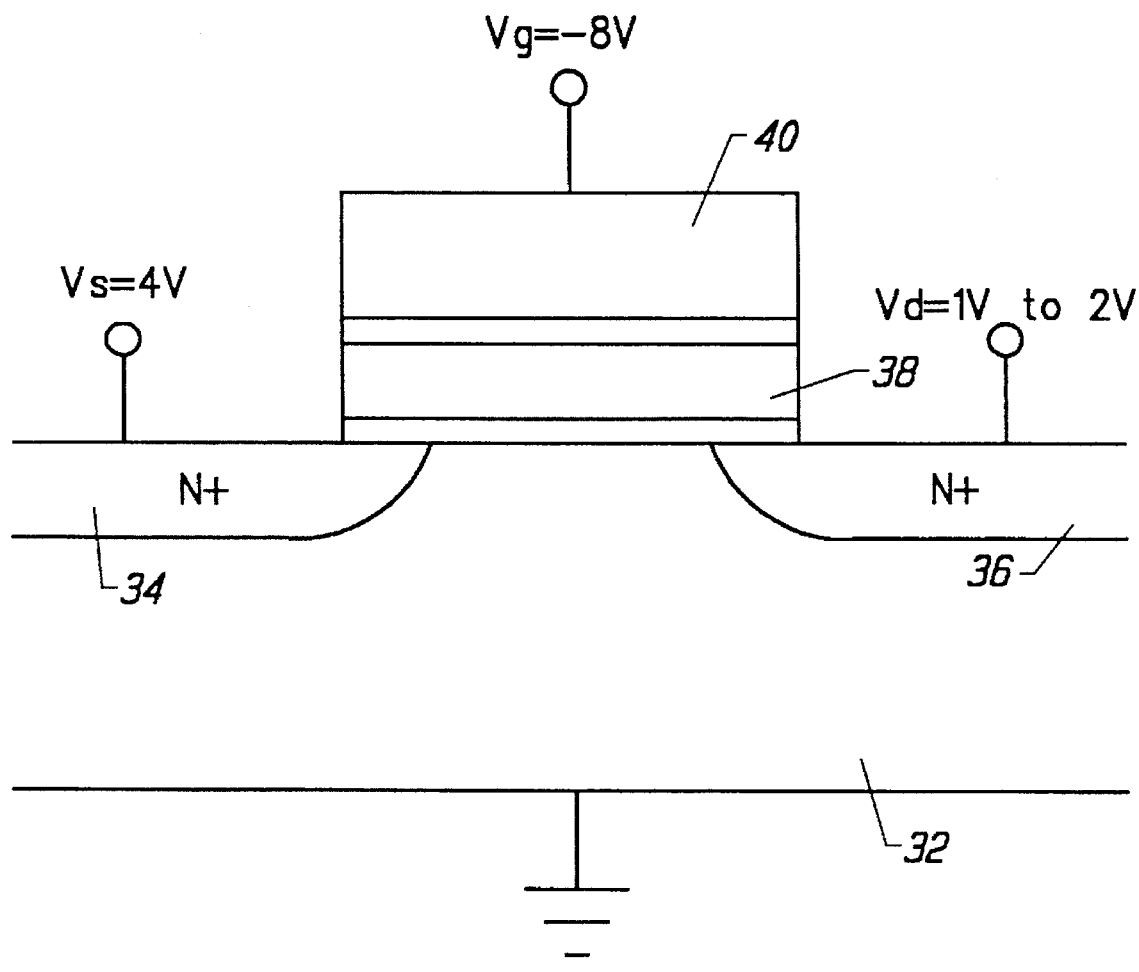
FIG. 13 is a device cross-section representing the scheme of the present invention for inhibiting damage in floating gate transistors.

FIG. 13 shows one embodiment of the system of the present invention for inhibiting the damage caused by hot hole injection for extreme short channel gate lengths. As shown in FIG. 13, during discharge, the floating gate transistor device has a source voltage applied of four volts, a gate voltage of −8 volts, and the drain is held at a positive voltage of 0.5 to 2 volts. By putting a positive bias on the drain node, discharge of electrons from the floating gate will proceed through the source electron since the positive bias on the drain will reduce or eliminate the lateral field $\vec{E}$ to the point where it has no effect on hole movement. This bias will inhibit the damage caused by the above-mentioned situation with respect to FIG. 10 by preventing formation of the lateral electric field and holes will proceed along arrow 46 in their intended path.

In the cases of a negative gate source side erase (removal of electrons from the floating gate), the scheme shown in FIG. 13 can be realized easily.

Figure 1:
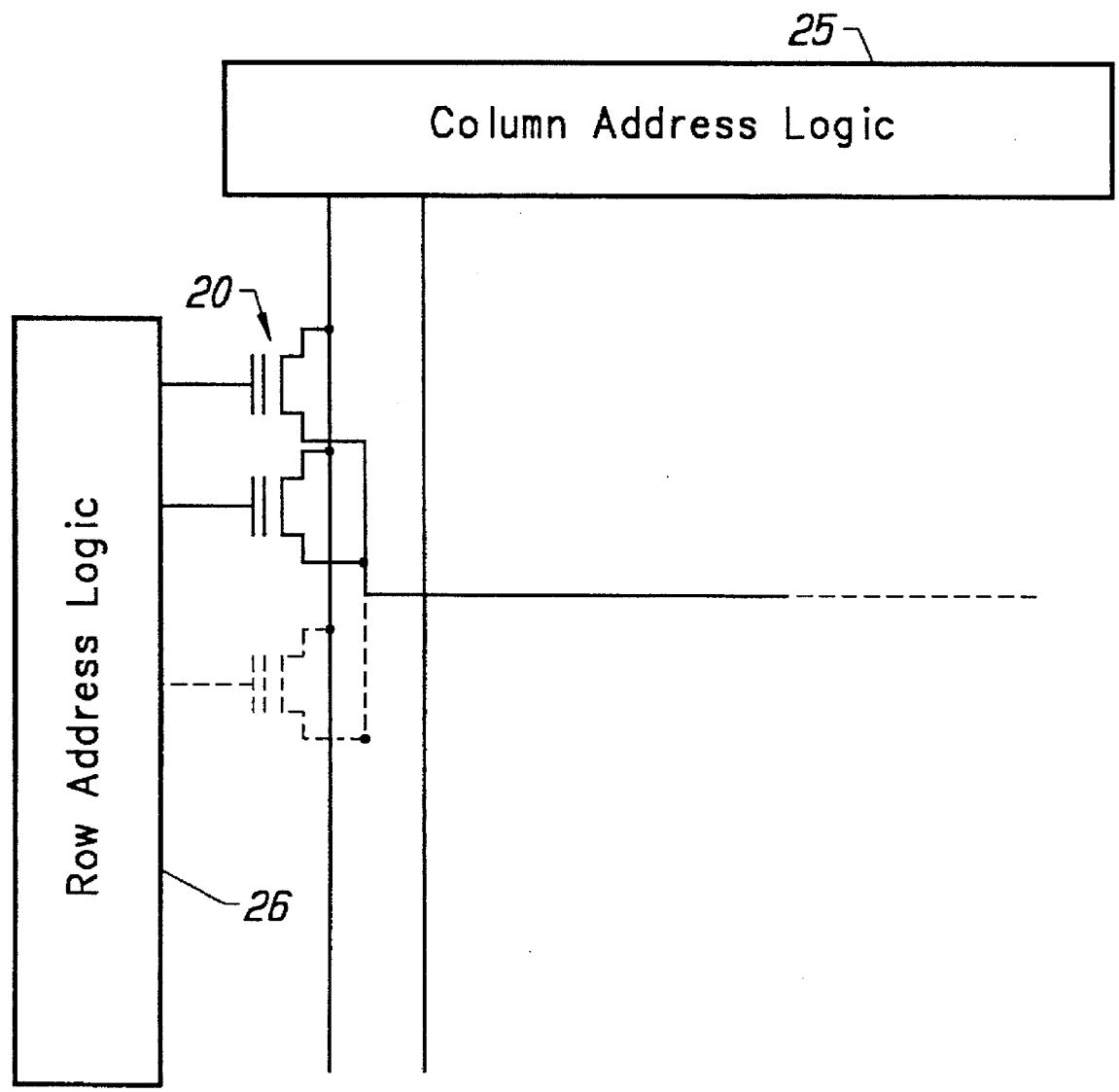
FIG. 1 is a block representation of an array of floating gate transistors suitable for use in accordance with the present invention.

In the array as shown in FIG. 1, one could bias the drain or bit lines to a voltage of 1 to 2 volts, for example, during the erasing step. One may leave the erase-verify bit-line voltage always on, and there is no need to remove said voltage to float the drain electrode. This is one way to insure that the drain node is at a known potential of 1 to 2 volts, and not floating at the initial potential of zero. As shown in FIG. 12, this reduces the superfast erasure of bits. As shown in FIG. 12, in a situation where $V_g=(-)8$ volts, $V_s=4$ volts, and $V_t=2$ volts, the saturation of the threshold voltage vs. time is relatively steady. Where the drain is left floating with the same characteristics on the gate voltage and source voltage, the erasure occurs in an extremely short period of time. The erasure pulse is significantly only 0.1% of the entire time required to erase the array. Moreover, depending on the type of device, the erasure step is usually not as critical in terms of speed as the data storage step. In other words, in certain devices, it is more critical to write quickly than it is to erase quickly. In these instances, as long as all of the transistors erase at the same time, the integrity of the data cells can be maintained, and the benefits of the present invention are realized.

Figure 14:
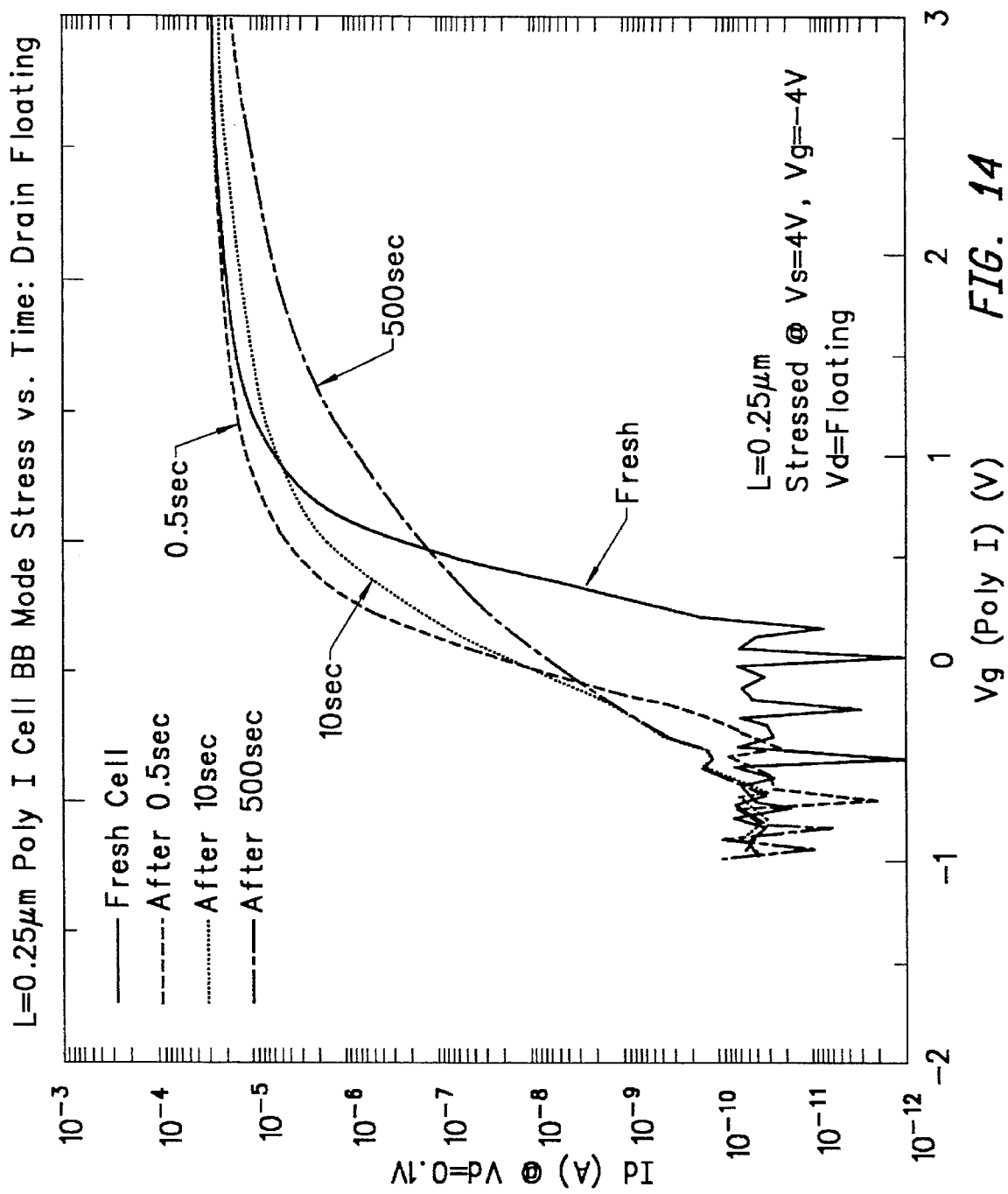
FIGS. 14 and 15 are graphs representing the cell stress vs. time for a single short-channel transistor device using two different sets of discharge conditions.
Figure 15:
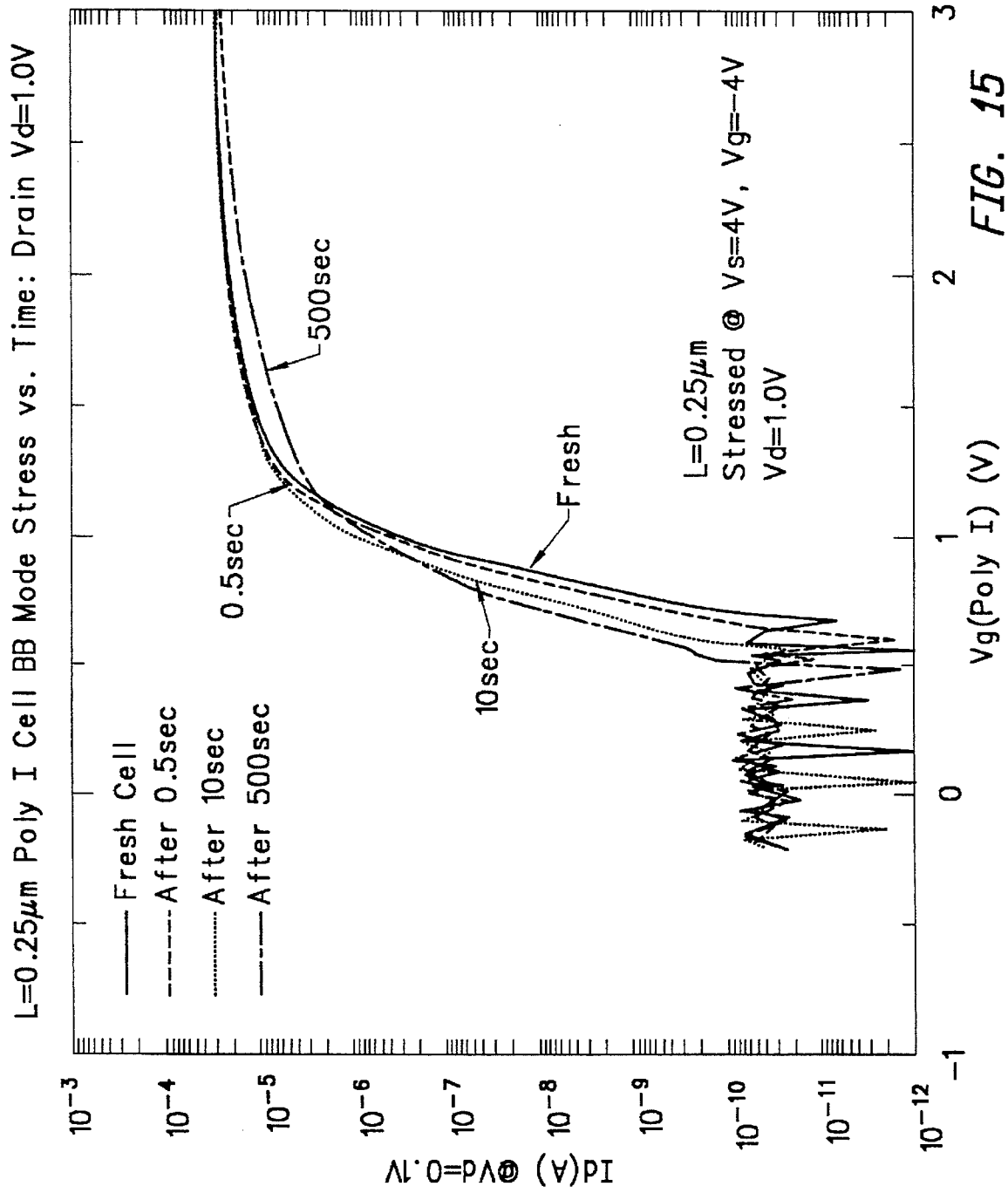

A significant advantage of the present invention is that it reduces damage for the short channel cells without significantly affecting the physical characteristics of the cell, erase voltages, or erase speed. FIGS. 14 and 15 are a comparison of an identical 0.25 μm channel length device under differing erase conditions after repeated erase cycles. As shown in FIG. 14, where the drain is left floating, the degradation of the cell gate voltage required to erase a cell over time significantly degrades. As shown in FIG. 15, the degradation is substantially reduced where the drain voltage is held at 1 volt during repeated discharges of the same device.

Figure 16:
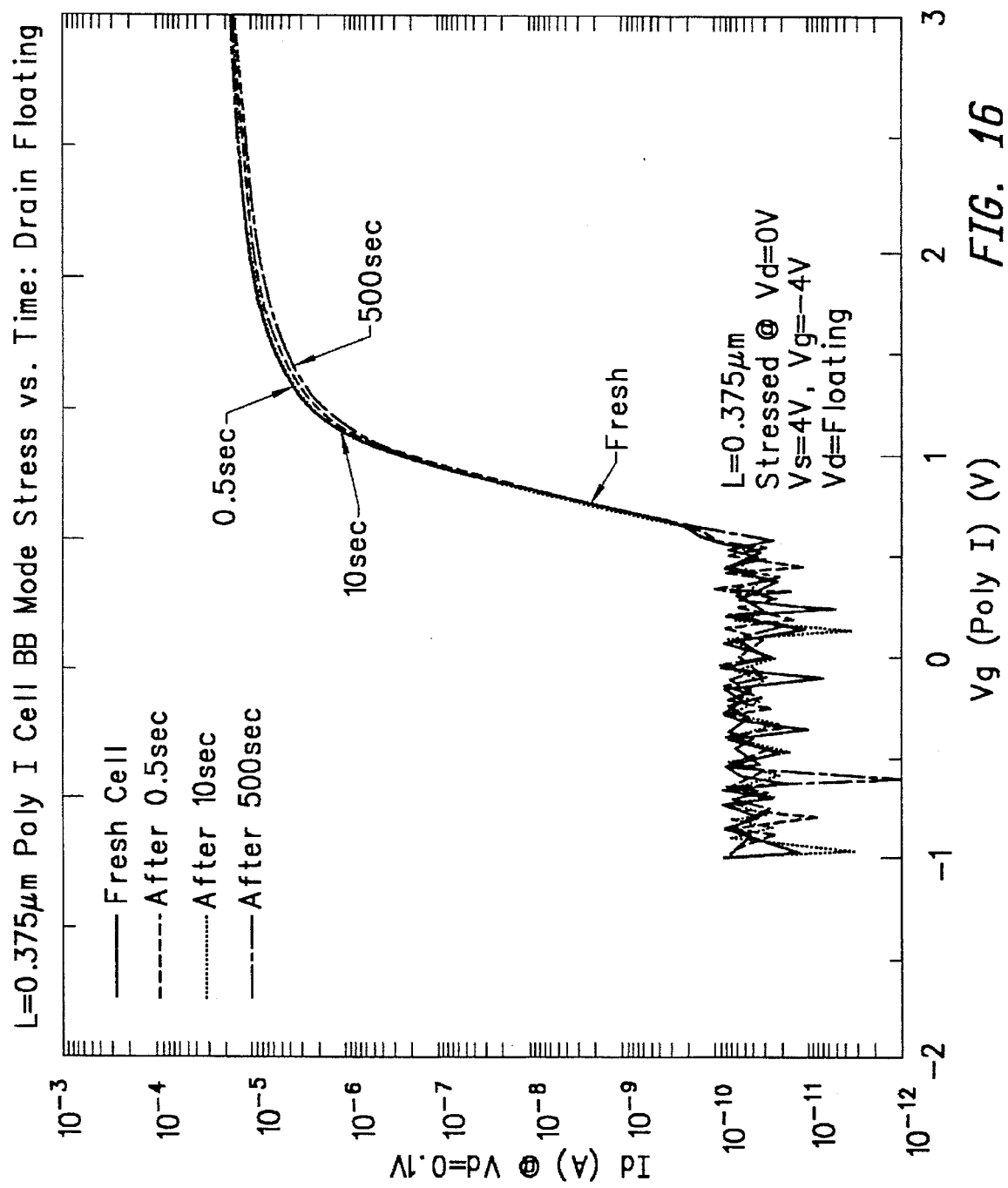
FIG. 16 is a graph representing the discharge stress vs. time for a floating gate device having a longer channel length than that shown in FIGS. 14 and 15.

As shown in FIG. 16, the device of FIG. 15 achieves the same results as the device of FIG. 16 without the channel length increase. FIG. 16 shows a longer, 0.375 µm channel length device with a floating drain.

Figure 17:
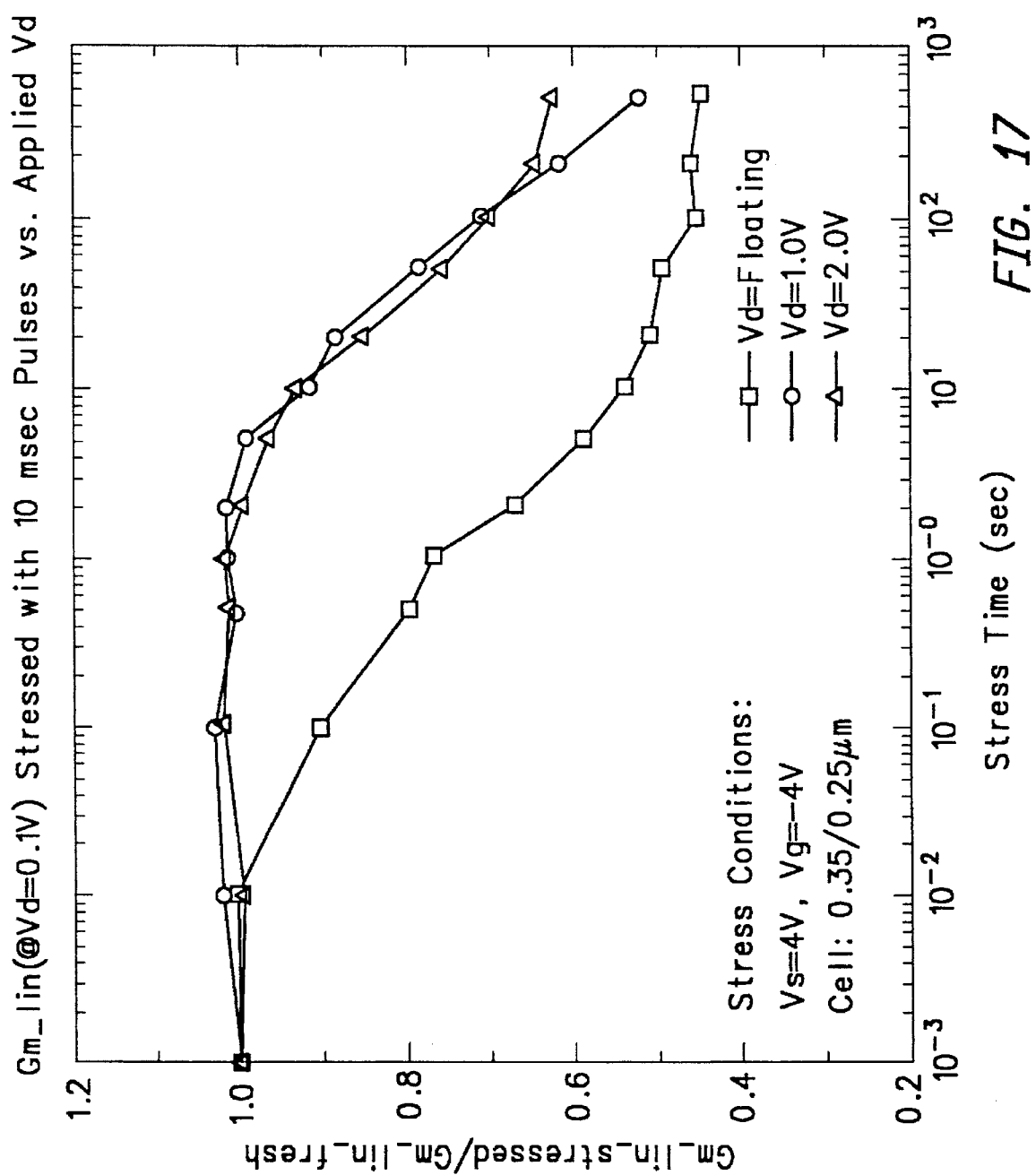
FIGS. 17–19 are graphs representing the linear transconductance vs. time under varying sets of discharge conditions in accordance with the present invention.
Figure 18:
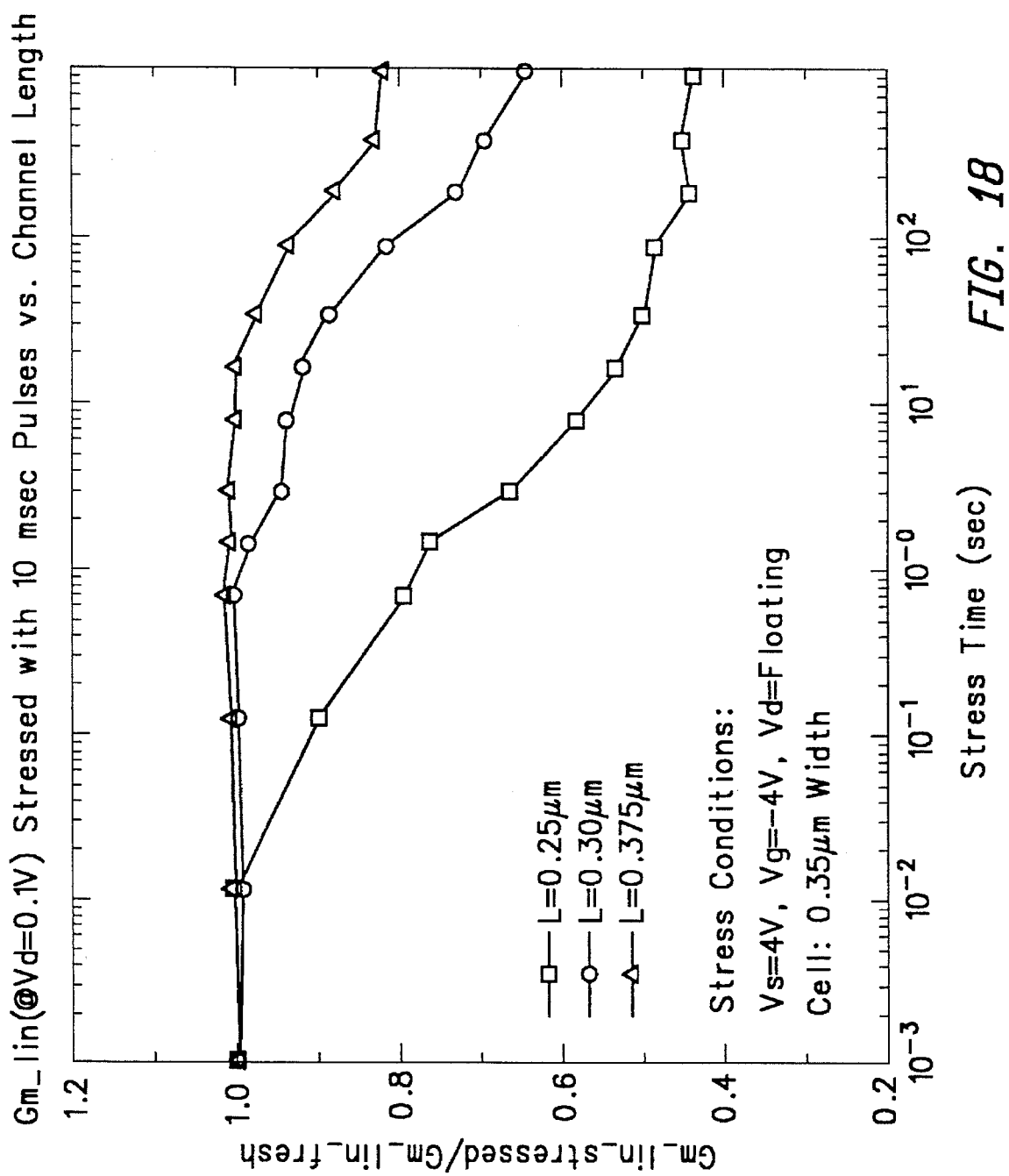
Figure 19:
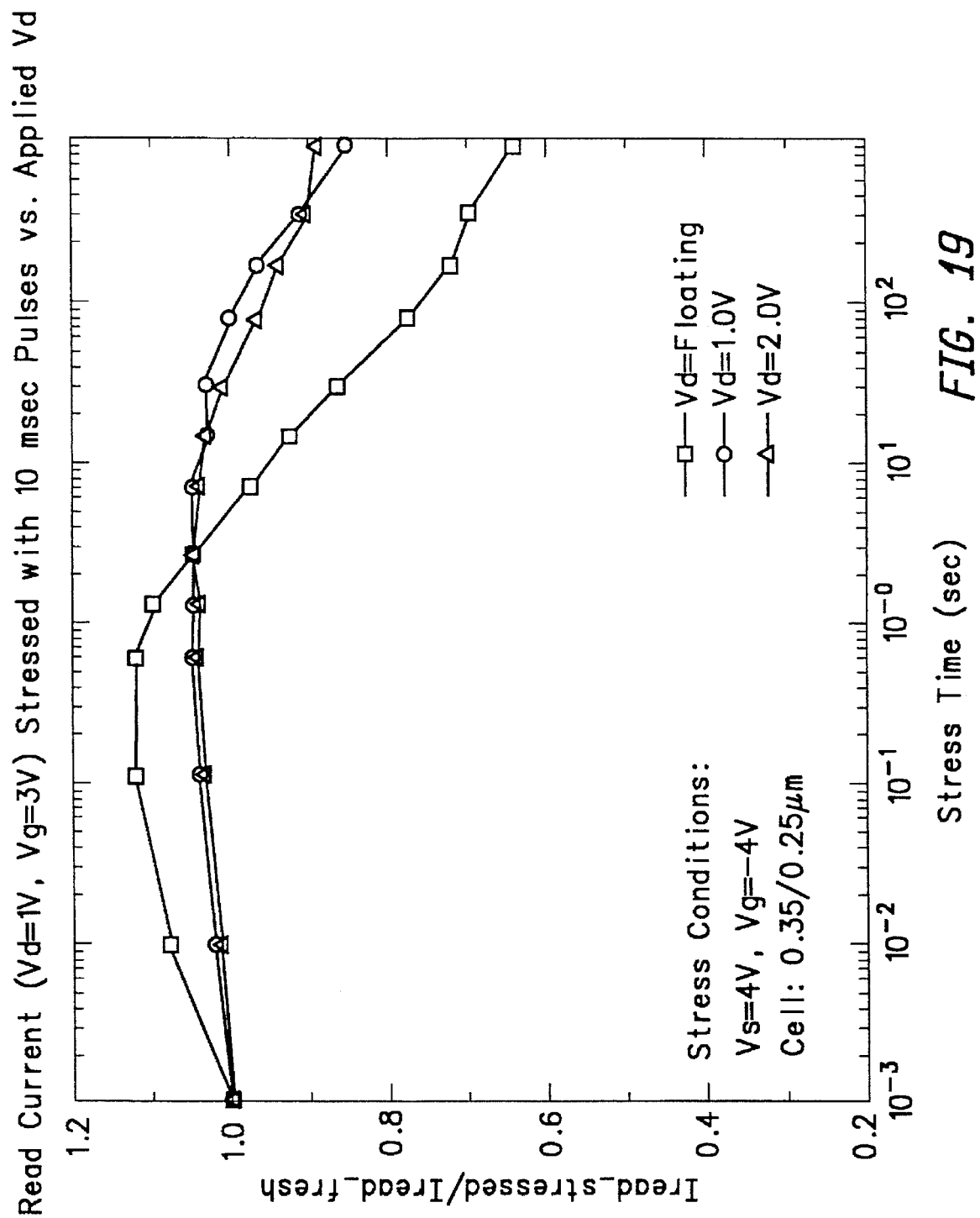

FIGS. 17, 18, and 19 show the measured linear transconductance as a function of the stress time and drain node bias conditions for the floating drain, 1 volt, and 2 volt bias conditions, respectively, in a 0.25 µm length (0.35 µm width) device under repeated erase stress conditions.

Other solutions to the problem of degradation will not provide as advantageous result as that presented herein. One possible solution would be to increase the channel length of the devices. While this will reduce the degradation effects, it will not allow the significant scaling necessary in current commercial embodiments of bit arrays. A second solution might be to change the doping density of the source and drain regions. However, this solution is extremely limited and significantly alters each device's performance. The voltage threshold utilized to erase the bit can also be adjusted, but since it must be lowered to avoid damaging the cells, this solution will significantly increase the time required to erase the array. Each of the other control factors has significant limits which prevent them being as advantageous a solution as that presented herein.

As should be recognized by one of average skill in the art, the present invention can be implemented in the bit array shown in FIG. 1. Typically, erasing the bit array, where the erasure step involves removing electrons from the floating gate, involves sending the required erase pulse of voltages on the respective nodes to the individual gates, and then sending a verify pulse on the read lines of the array to determine if in fact the array has been erased.

In the situation where the array exists in an erased state when charge is present on the floating gate, and a write to the array comprises selectively discharging individual cells, the problem of fast erase bits, and degradation of the discharge of the cells becomes more acute. This is because if other solutions such as increasing the erase voltage are adopted, as the voltage is increased with each successive discharge function, the cell will become more and more difficult to discharge, and will increase the write time of the device. As the write time of the device is increased, the advantages of using the flash EPROM array to store the data are significantly reduced. The present invention provides a simple and effective solution to these problems. It should be recognized by one of average skill in the art that the invention is not limited to flash EEPROM or EEPROM devices, but can be utilized in any situation or charges to be removed from a floating gate device.

In addition, while the background herein describes discharging the floating gate from the source side of the transistor, in the future, device manufacturers may turn to discharging from the drain side of the device. Currently, discharging from the source side is advantageous since all the source electrodes may be tied together, the drain is generally charged up, and erasing half a million bits or a million bits at the same time is a relatively quick operation lasting about 10 milliseconds. However, where discharging is occurring on the drain side, and the discharge consists of a write operation, floating the source electrode to accomplish this would require charging a capacitor on the drain side of the device using only 8 bits in the case of a byte write. This would dramatically increase the write time of the device, since much more time would be required to charge the capacitor. The severity of the problem would increase by six orders of magnitude.

The many features and advantages of the present invention will be apparent to one of average skill in the art. All such features and advantages are intended to be within the scope of the present invention as defined by the written description, the figures, and the following claims. For example, the present invention is not limited to any particular type of floating gate technology, nor any particular type of gate array, but can be utilized with any numerous different types of technologies and arrays. Moreover, the particular voltages set forth herein would be varied according to the particular technology utilized, in accordance with the problem recognized by the inventors, depending on the particular technology, the speed of the desired erasure, and other factors. These and other features, advantages and variations are intended to be within the spirit of the present invention as defined herein.

What is claimed is:

1. A process for discharging a floating gate active semiconductor device formed in a semiconductor substrate, the device having a first active region, a second active region, a charge holding region, a control gate region and a channel between the first and second active regions, the channel having a length defined by a distance below the charge holding region between the first and second active regions, comprising:
    (a) applying a first positive voltage of about 4–8 volts to the first active region;
    (b) applying a second voltage in the range of about 0.5–2 volts to the second active region;
    (c) applying a third voltage in the range of minus 8 volts to the control gate region; and
    (d) coupling the substrate to ground.

2. The process of claim 1 wherein the second voltage is lower than the first voltage.

3. The process of claim 1 wherein said first active region comprises a source region of a MOSFET.

4. The process of claim 1 wherein said second active region comprises a drain region of a MOSFET.

5. The process of claim 1 wherein said first active region comprises a drain region of a MOSFET.

6. The process of claim 1 wherein said second active region comprises a source region of a MOSFET.

7. The process of claim 1 wherein the channel length of the device is less than 0.5 micrometers.

8. The process of claim 7 wherein the channel length of the device is about 0.4 micrometers.

9. A method for inhibiting a lateral electric field during the discharge of electrons from a floating gate device formed on a semiconductor substrate, said device including a control gate, a floating gate, a first active region and a second active region, and a channel between the first and second active regions the floating gate device having a channel length of less than one micron, comprising:
    determining, for the floating gate device, whether the discharge of electrons from the floating gate inhibits the discharge characteristics of the device;
    coupling a negative voltage to the control gate, and coupling the substrate to ground; and
    coupling a first positive voltage to the first active region and a second positive voltage to the second active region said second voltage being different from said first voltage.

10. The method of claim 9 wherein the first positive voltage is on the order of 4 volts.

11. The method of claim 9 wherein the second positive voltage is on the order of 0.5–2 volts.

12. The method of claim 11 wherein the second positive voltage is in the range of 1–2 volts.

13. The method of claim 9 wherein said determining step includes determining the first and second positive voltages based upon said channel length, the size of the floating gate and the materials of which the floating gate device is comprised.

14. The method of claim 13 wherein said coupling step includes coupling the first voltage and the second voltage having a relative ratio of magnitudes of between 8:1 and 2:1.

15. A semiconductor device formed in a substrate, comprising;

a first active region;

a second active region;

a channel disposed between the first and the second active regions said channel having a length of less than 0.4 micrometers;

a control gate region;

and a charge storing region;

wherein during discharge the first active region is coupled to a first positive voltage in the range of about 4–8 volts, the second active region is coupled to a different, second positive voltage in the range of about 0.5–2 volts, the control gate region is coupled to a negative voltage in the range of minus 8 volts and the substrate is coupled to ground.

16. The apparatus of claim 15 wherein said first active region comprises a source region of a MOSFET.

17. The apparatus of claim 15 wherein said second active region comprises a drain region of a MOSFET.

18. The apparatus of claim 15 wherein said first active region comprises a drain region of a MOSFET.

19. The apparatus of claim 15 wherein said second active region comprises a source region of a MOSFET.

20. A method of discharging an array of charge storage devices, each charge storage device comprising a first active region, a second active region, and a charge carrying element, at least one of the charge carrying devices being formed in a semiconductor substrate, each of the devices in the array being selectively chargeable or dischargeable so as to place or remove electrons from the charge storage device to represent an increment of data in the array, comprising the steps of:

(a) coupling a negative voltage to the control gate;

(b) coupling the substrate to ground; and (c) coupling a first positive voltage to the first active region; and (d) coupling a second positive voltage to the second active region said second positive voltage being different from said first positive voltage.

21. The method of claim 20 wherein said step (c) comprises coupling the first active region to the first positive voltage simultaneously.

22. The method of claim 20 wherein said step (d) comprises coupling the first active region to the second positive voltage simultaneously.

23. A process for discharging a floating gate active semiconductor device formed in a semiconductor substrate, the device having a source, a drain, a charge holding region, a control gate and a channel between the source and drain, the channel having a length defined by a distance below the charge holding region between the source and drain, comprising:

(a) applying a first voltage of about 4–8 volts to the source;

(b) applying a second voltage in the range of about 0.5–2 volts to the drain;

(c) applying a third voltage in the range of minus volts to the control gate; and (d) coupling the substrate to ground.

24. The process of claim 23 wherein the channel length of the device is less than 0.5 micrometers.

25. The process of claim 24 wherein the channel length of the device is about 0.4 micrometers.

\* \* \* \* \*